(12) United States Patent
Kim

(10) Patent No.: US 12,079,433 B2
(45) Date of Patent: Sep. 3, 2024

(54) TOUCH DISPLAY DEVICE AND DISPLAY PANEL

(71) Applicant: LG DISPLAY CO., LTD., Seoul (KR)

(72) Inventor: CheolSe Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 18/214,615

(22) Filed: Jun. 27, 2023

(65) Prior Publication Data

US 2024/0045551 A1 Feb. 8, 2024

(30) Foreign Application Priority Data

Aug. 4, 2022 (KR) .......................... 10-2022-0097244

(51) Int. Cl.
  *G06F 3/044* (2006.01)
  *G06F 3/041* (2006.01)
  *H10K 59/40* (2023.01)
  *G09G 3/32* (2016.01)

(52) U.S. Cl.
  CPC .......... *G06F 3/0443* (2019.05); *G06F 3/0412* (2013.01); *G06F 3/0416* (2013.01); *G06F 3/0448* (2019.05); *H10K 59/40* (2023.02); *G06F 2203/04111* (2013.01); *G09G 3/32* (2013.01); *G09G 2300/0408* (2013.01); *G09G 2300/0426* (2013.01); *G09G 2300/0842* (2013.01)

(58) Field of Classification Search
  CPC .... G06F 3/0443; G06F 3/0448; G06F 3/0412; G06F 3/0416; G06F 2203/04111; H10K 59/40; G09G 3/32; G09G 2300/0408; G09G 2300/0426; G09G 2300/0842
  See application file for complete search history.

(56) References Cited

U.S. PATENT DOCUMENTS

2017/0300155 A1* 10/2017 Gu ..................... G02F 1/134336
2018/0356917 A1* 12/2018 Lee ........................ H05K 3/285
2018/0356932 A1* 12/2018 Shepelev .............. G06F 3/0412
2018/0358413 A1* 12/2018 Lee ..................... G06F 3/04164

* cited by examiner

*Primary Examiner* — Sejoon Ahn
(74) *Attorney, Agent, or Firm* — Birch, Stewart, Kolasch & Birch, LLP

(57) ABSTRACT

A display panel including a substrate; a driving transistor on the substrate; a first passivation layer covering the driving transistor; a touch line formed on the first passivation layer; a second passivation layer covering the touch line; an anode electrode formed on the second passivation layer and electrically connected to the driving transistor through a contact hole in the first passivation layer and the second passivation layer; a touch electrode formed on the second passivation layer at a position spaced apart from the anode electrode and electrically connected to the touch line through a touch contact hole of the second passivation layer; a bank covering the anode electrode and the touch electrode and having an opening corresponding to an emission area; and a light emitting layer and a cathode electrode sequentially formed on the anode electrode in the emission area.

19 Claims, 12 Drawing Sheets

TOUCH DISPLAY DEVICE AND DISPLAY PANEL

CROSS-REFERENCE TO RELATED APPLICATION

This application claims priority under 35 U.S.C. § 119(a) to Application No. 10-2022-0097244, filed in the Republic of Korea on Aug. 4, 2022, which is hereby expressly incorporated by reference into the present application.

BACKGROUND OF THE DISCLOSURE

Field

Embodiments of the disclosure relate to a touch display device and a display panel.

Description of the Related Art

Flat panel display devices include liquid crystal displays, plasma display panels, and organic light emitting displays. Also in wide use are touch display devices having a touch panel stacked on the display device. In more detail, the touch display devices detect a touch point based on a changing electrical characteristic such as resistance or capacitance at the touch point. The touch display device can thus function as a user interface.

However, the touch display device includes a separately stacked touch panel, which increases the thickness of the display device. In addition, the light transmittance is reduced and the manufacturing cost is increased. Thus, advanced in-cell touch (AIT)-type display devices include built-in touch electrodes inside the pixel areas of the display panel.

However, an AIT type display device includes additional touch electrodes and touch lines for sensing a touch, which adds to the manufacturing process for forming the display device.

SUMMARY OF THE DISCLOSURE

Accordingly, one object of the present disclosure is to address the above-noted and other problems in the related art.

Another object of the present disclosure is to simplify the process of manufacturing a touch display device and a display panel and reduce the manufacturing costs.

Still another object of the present disclosure is to simplify the manufacturing process and reduce the manufacturing costs by forming the touch electrode with the same material as the anode electrode of the light emitting element.

Yet another object of the present disclosure is to form an anti-deposition film for preventing deposition of a cathode electrode on the touch electrode.

Still another object of the present disclosure is to provide an undercut structure between the touch electrode and the anode electrode.

To achieve these and other advantages and in accordance with the purpose of the present invention, as embodied and broadly described herein, the present disclosure provides in one aspect a display panel including a substrate, a transistor formed on the substrate, a first passivation layer covering the transistor, a touch line formed on the first passivation layer, a second passivation layer covering the touch line, an anode electrode formed in an emission area on the second passivation layer and electrically connected to the transistor through a contact hole of the first passivation layer and the second passivation layer, a touch electrode formed on the second passivation layer at a position spaced apart from the anode electrode and electrically connected to the touch line through a touch contact hole of the second passivation layer, a bank covering the anode electrode and the touch electrode and having the emission area open, and a light emitting layer and a cathode electrode sequentially formed on the anode electrode in the emission area. The present disclosure also provides a corresponding touch display device including the display panel.

In another aspect, the present disclosure provides a display panel including a substrate, a transistor formed on the substrate, a first passivation layer formed to cover the transistor, a touch line formed on the first passivation layer, a second passivation layer formed to cover the touch line and including an undercut area between an emission area and a non-emission area, an anode electrode formed in the emission area on the second passivation layer and electrically connected to the transistor through a contact hole of the first passivation layer and the second passivation layer, a touch electrode formed in the non-emission area on the second passivation layer at a position spaced apart from the anode electrode and electrically connected to the touch line through a touch contact hole of the second passivation layer, a bank covering the anode electrode and the touch electrode and having the emission area open, a light emitting layer and a cathode electrode sequentially formed on the anode electrode in the emission area, and a floating electrode formed at a position spaced apart from the cathode electrode in the non-emission area. The present disclosure also provides a corresponding touch display device including the display panel.

Accordingly, the present disclosure provides the following advantages. First, the present disclosure advantageously reduces manufacturing costs by simplifying the manufacturing process.

The present disclosure simplifies the manufacturing process and reduces the manufacturing costs by forming the touch electrode with the same material as the anode electrode of the light emitting element.

The present disclosure also enables effective touch sensing through the touch electrode formed of the same material as the anode electrode by forming an anti-deposition film capable of preventing deposition of a cathode electrode on the touch electrode.

Further, the present disclosure enables effective touch sensing through insulation from the cathode electrode even when a floating electrode formed of the same material as the cathode electrode is deposited on the touch electrode through an undercut structure between the touch electrode and the anode electrode.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
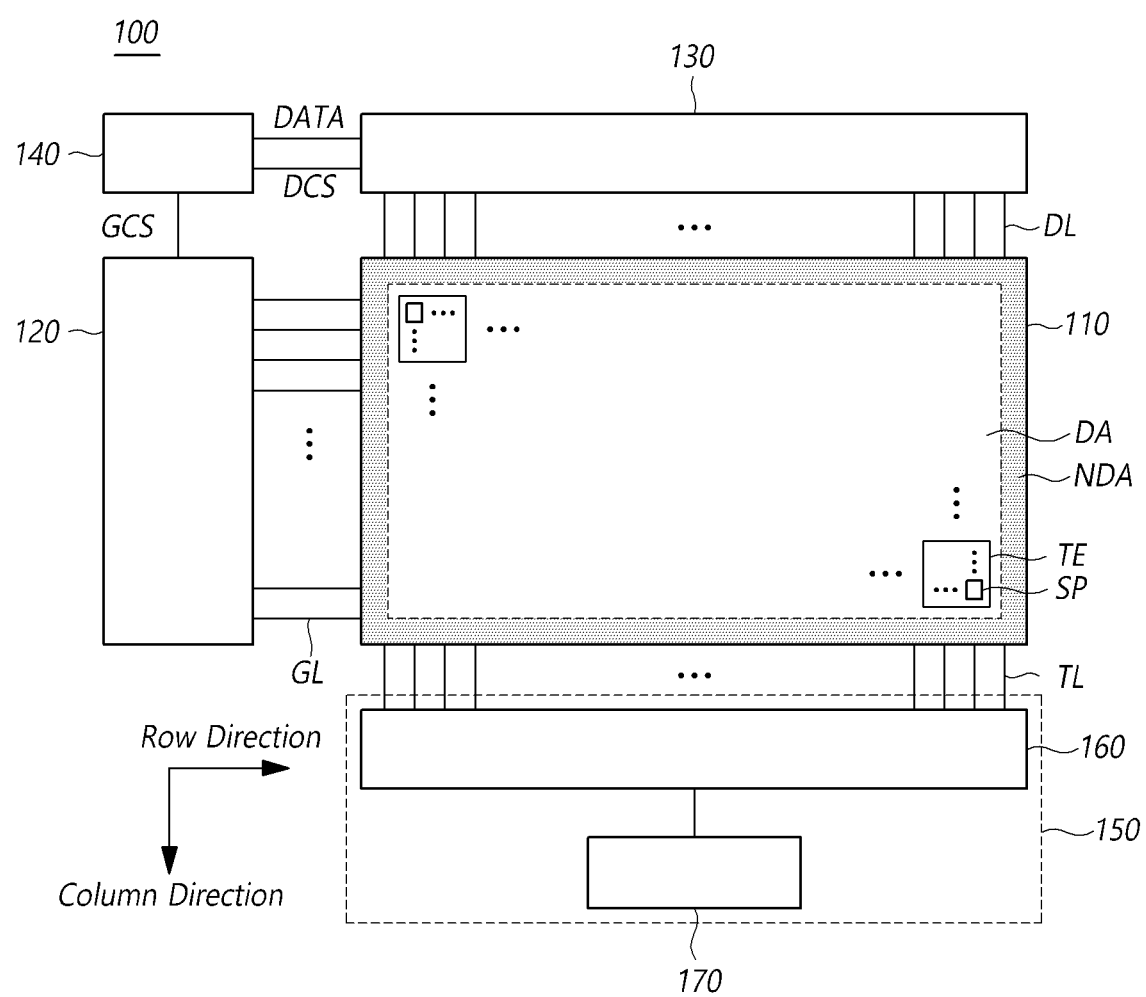
FIG. 1 is a view schematically illustrating a touch display device according to embodiments of the disclosure.

Hereinafter, some embodiments of the disclosure will be described in detail with reference to exemplary drawings. In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. The terms such as "including," "having," "containing," "constituting" "make up of," and "formed of" used herein are generally intended to allow other components to be added unless the terms are used with the term "only". As used herein, singular forms are intended to include plural forms unless the context clearly indicates otherwise.

Terms, such as "first," "second," "A," "B," "(A)," or "(B)" may be used herein to describe elements of the disclosure. Each of these terms is not used to define essence, order, sequence, or number of elements etc., but is used merely to distinguish the corresponding element from other elements. When it is mentioned that a first element "is connected or coupled to," "contacts or overlaps" etc., a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap," etc. each other via a fourth element. Here, the second element may be included in at least one of two or more elements that "are connected or coupled to", "contact or overlap," etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together. In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure will be described in detail with reference to the accompanying drawings. In particular, FIG. 1 is a view schematically illustrating a touch display device 100 including a display panel 110, a data driving circuit 130, a gate driving circuit 120, and a timing controller 140. As shown, the display panel 110 includes a display area DA in which images are displayed and a non-display area NDA in which no image is displayed.

In more detail, the non-display area NDA is an outer area of the display area DA and can be referred to as a bezel area. The non-display area NDA can also be an area visible from the front of the touch display device 100 or an area that is bent and not visible from the front of the touch display device 100. Further, the display panel 110 includes a plurality of subpixels SP. The touch display device 100 can be various types of display devices including a liquid crystal display device, an organic light emitting display device, a micro light emitting diode (micro LED) display device, and a quantum dot display device.

In addition, the structure of each of the plurality of subpixels SP can vary according to the type of the touch display device 100. For example, when the touch display device 100 is a self-emission display device in which the subpixels SP emit light by themselves, each subpixel SP can include a light emitting element that emits light, one or more transistors, and one or more capacitors.

The display panel 110 can further include various types of signal lines to drive the subpixels SP. For example, the signal lines can include a plurality of data lines DL transferring data signals (also referred to as data voltages or image data) and a plurality of gate lines GL transferring gate signals (also referred to as scan signals).

Further, the data and gate lines DL and GL can cross each other. Also, each data DL can extend in a column direction and each gate GL can extend in a row direction. Here, the column and row direction are relative. For example, the column direction can be a vertical direction and the row direction can be a horizontal direction. As another example, the column direction can be a horizontal direction and the row direction can be a vertical direction.

In addition, the data driving circuit 130 drives the data lines DL, and can output data signals to the data lines DL. The gate driving circuit 120 drives the gate lines GL, and can supply gate signals to the gate lines GL.

Further, the timing controller 140 controls the data driving circuit 130 and the gate driving circuit 120 and controls driving timings for the data lines DL and the gate lines GL. In addition, the timing controller 140 supplies various types of data driving control signals DCS to the data driving circuit 130 to control the data driving circuit 130 and supplies various types of gate driving control signals GCS to the gate driving circuit 230 to control the gate driving circuit 120.

In addition, the data driving circuit 130 supplies data signals to the data lines DL according to the driving timing control by the timing controller 140. The data driving circuit 130 can also receive digital image data DATA from the timing controller 140, convert the received image data DATA into analog data signals and output the data signals to the data lines DL.

Further, the gate driving circuit 120 supplies gate signals to the gate lines GL according to the timing control of the timing controller 140. The gate driving circuit 120 can also receive a first gate voltage corresponding to a turn-on level voltage and a second gate voltage corresponding to a turn-off level voltage, along with various gate driving control signals GCS, and supply generated gate signals to the gate lines GL. In addition, the turn-on level voltage can be a high level voltage, and the turn-off level voltage can be a low level voltage. Conversely, the turn-on level voltage can be a low-level voltage, and the turn-off level voltage can be a high-level voltage.

As shown in FIG. 1, to provide a touch sensing function as well as an image display function, the touch display device 100 includes a touch panel and a touch circuit 150 that senses the touch panel to detect whether a touch occurs by a touch object, such as a finger or pen, and can detect the position of the touch. As shown, the touch circuit 150 can include a touch driving circuit 160 that drives and senses the touch panel and generates and outputs touch sensing data, and a touch controller 170 that can detect an occurrence of a touch and the position of the touch using touch sensing data.

In addition, the touch panel can include a plurality of touch electrodes TE as touch sensors. The touch panel can further include a plurality of touch lines TL for electrically connecting the touch electrodes TE and the touch driving circuit 160. The touch panel or touch electrode TE is also referred to as a touch sensor.

Further, the touch panel can exist outside or inside the display panel 110. When the touch panel exists outside the display panel 110, the touch panel is referred to as an external-type touch panel. When the touch panel is of the external type, the touch panel and the display panel 110 can be separately manufactured or be combined. The external-type touch panel can also include a plurality of touch electrodes TE on a substrate.

When the touch panel exists inside the display panel 110, the touch panel is referred to as an internal-type touch panel. In more detail, in the internal-type touch panel, the touch panel is formed in the display panel 110 during a manufacturing process of the display panel 110. The touch driving circuit 160 supplies a touch driving signal to at least one of the touch electrodes TE and detects a touch sensing signal transferred from at least one touch electrode TE among the touch electrodes TE.

In addition, the touch circuit 150 can perform touch sensing in a self-capacitance or a mutual-capacitance sensing scheme. For the self-capacitance sensing scheme, the touch circuit 150 performs touch sensing based on a capacitance between each touch electrode TE and the touch object (e.g., finger or pen). For the mutual-capacitance sensing scheme, the touch circuit 150 can perform touch sensing based on a changing capacitance between the touch electrodes TE.

In addition, according to the mutual-capacitance sensing scheme, the touch electrodes TE are divided into driving touch electrodes and sensing touch electrodes. Further, the touch driving circuit 160 can drive the driving touch electrodes by the touch driving signal and can detect the touch sensing signal from the sensing touch electrodes.

According to the self-capacitance sensing scheme, each of the touch electrodes TE can serve both as a driving touch electrode and as a sensing touch electrode. The touch driving circuit 160 can thus drive all or some of the touch electrodes TE and sense all or some of the touch electrodes TE.

Further, the touch driving circuit 160 and the touch controller 170 can be implemented as separate devices or as a single device. Also, the touch driving circuit 160 and the data driving circuit 130 can be implemented as separate integrated circuits. Further, the whole or part of the touch driving circuit 160 and the data driving circuit 130 can be integrated into a single integrated circuit.

In addition, the touch display device 100 can be a self-emissive display device having self-emissive light emitting elements disposed on the display panel 110, such as an organic light emitting display device, a quantum dot display device, a micro LED display device, and the like.

Figure 2:
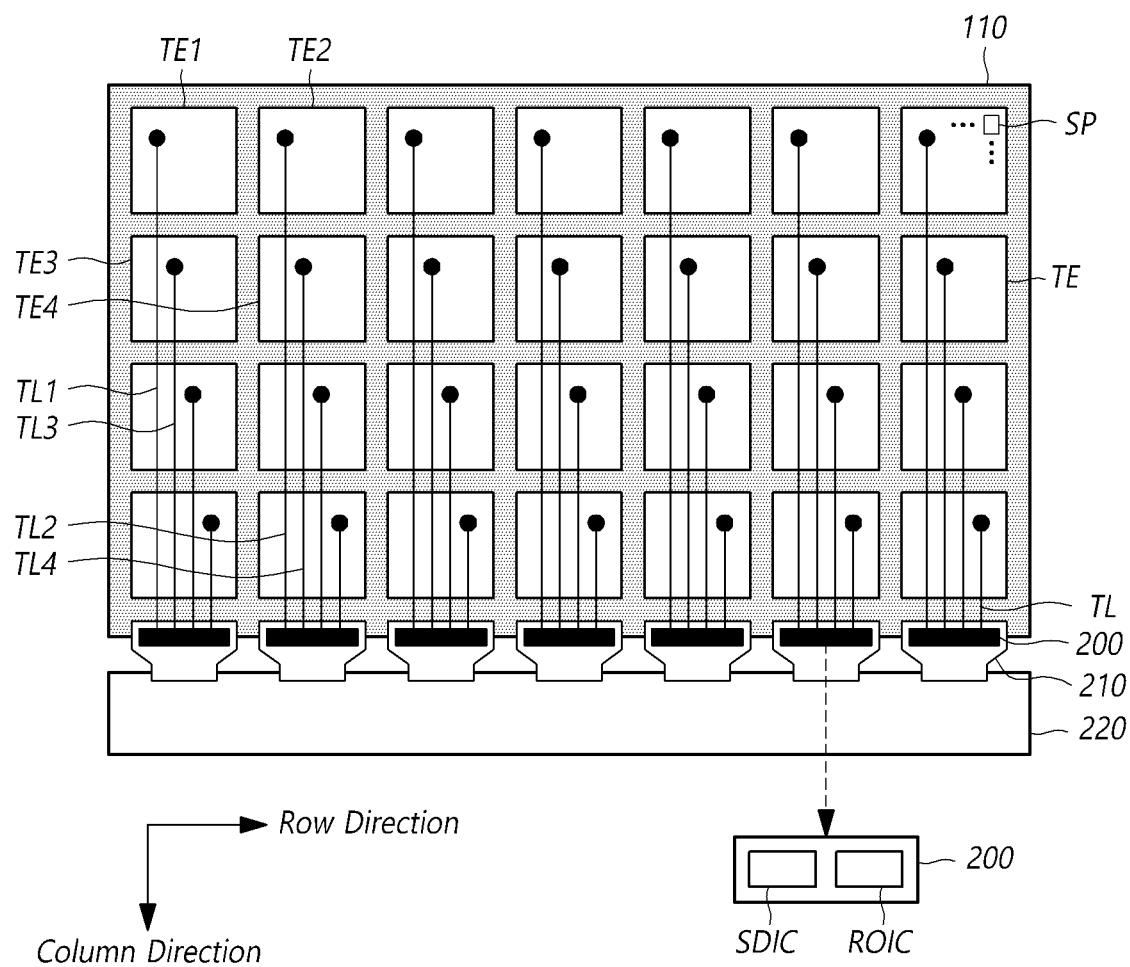
FIG. 2 is a view illustrating an example touch sensing system of a touch display device according to embodiments of the disclosure.

Next, FIG. 2 is a view illustrating an example touch sensing system of a touch display device according to embodiments of the disclosure. Referring to FIG. 2, the display panel 110 includes touch electrodes TE, touch lines TL, the touch driving circuit 160, and the touch controller 170.

In addition, the data driving circuit 130 can include a plurality of data driving integrated circuits SDICs, and the touch driving circuit 160 can include a plurality of touch driving integrated circuits ROIC. Each data driven integrated circuits SDIC can be implemented as a separate integrated circuit, and each touch driving integrated circuits ROIC can be implemented as a separate integrated circuit. Alternatively, at least one data driving integrated circuit SDIC and at least one touch driving integrated circuit ROIC can be integrated into one integrated circuit 200 as shown in FIG. 2.

Therefore, the touch display device 100 can include one or more integrated circuits 200 including at least one data driving integrated circuit SDIC and at least one touch driving integrated circuit ROIC. For example, in the touch display device 100, each integrated circuit 200 can be mounted on the circuit film 210. Also, one side of the plurality of circuit films 210 on which the plurality of integrated circuits 200 are mounted can be electrically connected to the display panel 110.

Alternatively, each integrated circuit 200 can be directly mounted in the bezel area of the display panel 110. Further, the other side of the circuit films 210 on which the integrated circuits 200 are mounted can be electrically connected to the printed circuit board 220. In addition, each touch electrode TE can be electrically connected to the touch driving integrated circuit ROIC through at least one touch line TL. The touch electrodes TE can also be positioned on the same layer, and the touch lines TL can be positioned on a different layer from that of the touch electrodes TE.

As shown in FIG. 2, the touch electrodes TE can include a first touch electrode TE1, a second touch electrode TE2 adjacent to the first touch electrode TE1 in a row direction, a third touch electrode TE3 adjacent to the first touch electrode TE1 in a column direction, and a fourth touch electrode TE4 adjacent to the third touch electrode TE3 in the row direction. In addition, the first touch electrode TE1 can be electrically connected to the first touch line TL1, the second touch electrode TE2 can be electrically connected to the second touch line TL2, the third touch electrode TE3 can be electrically connected to the third touch line TL3, and the fourth touch electrode TE4 can be electrically connected to the fourth touch line TL4.

Further, the first touch line TL1 overlaps the third touch electrode TE3 but is not electrically connected to the third touch electrode TE3. Also, as shown, the second touch line TL2 overlaps the fourth touch electrode TE4 but is not electrically connected to the fourth touch electrode TE4. In addition, each of the touch electrodes TE can overlap one or more subpixels SP. For example, one touch electrode TE can overlap two or more subpixels SP. Also, the area size of one touch electrode TE can correspond to the area size of two or more subpixels SP. In this instance, each touch electrode TE can overlap two or more data lines DL and two or more gate lines GL.

Because the first touch electrode TE1 and the second touch electrode TE2 are disposed in the same touch electrode row, they can overlap the same two or more gate lines GL. Also, because the third touch electrode TE3 and the fourth touch electrode TE4 are disposed in the same touch electrode row, they can overlap the same two or more gate lines GL.

In addition, because the first touch electrode TE1 and the third touch electrode TE3 are disposed in the same touch electrode column, they can overlap the same two or more data lines DL. Similarly, because the second touch electrode TE2 and the fourth touch electrode TE4 are disposed in the same touch electrode column, they can overlap the same two or more data lines DL. Further, each touch electrode TE can be a mesh-type electrode having a plurality of openings corresponding to an emission area or transmission area (or transparent area) of the subpixel SP.

Figure 3:
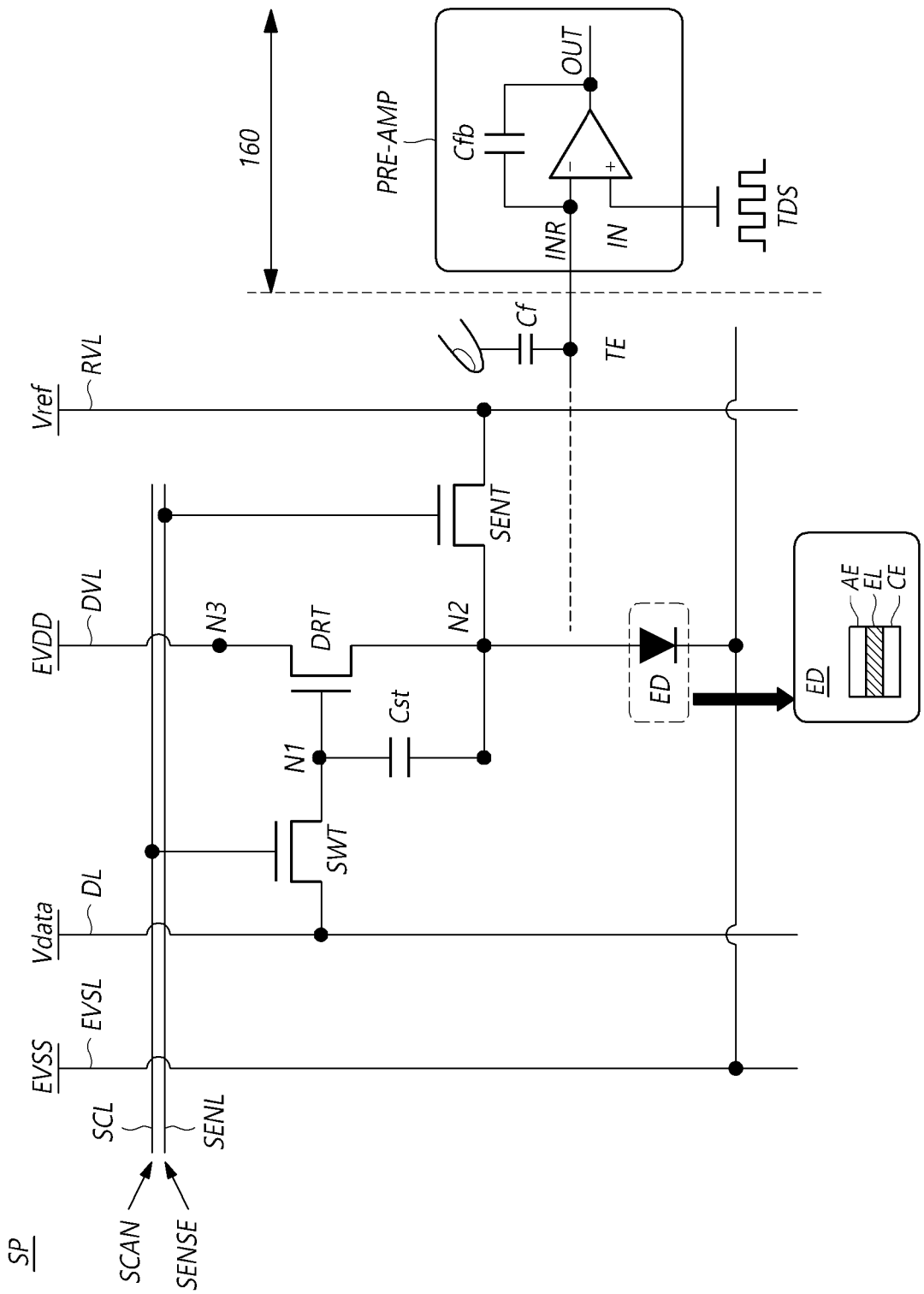
FIG. 3 is a view illustrating an example equivalent circuit of a subpixel constituting a display panel in a touch display device according to embodiments of the disclosure.

Next, FIG. 3 is a view illustrating an example equivalent circuit of a subpixel constituting a display panel in a touch display device according to an embodiment of the disclosure. Referring to FIG. 3, each subpixel SP incudes a light emitting element ED, a driving transistor DRT for driving the light emitting element ED, a switching transistor SWT for switching an electrical connection between the gate electrode of the driving transistor DRT and a data line DL, and a storage capacitor Cst electrically connected between the gate electrode of the driving transistor DRT and the source electrode or drain electrode of the driving transistor DRT. In addition, the gate electrode of the driving transistor DRT corresponds to the first node N1, the source electrode or drain electrode of the driving transistor DRT corresponds to the second node N2, and the drain electrode or source electrode of the driving transistor DRT corresponds to the third node N3.

Further, the light emitting element includes an anode electrode AE, a light emitting layer EL, and a cathode electrode CE. In more detail, the light emitting layer EL is positioned on the cathode electrode CE, and the anode electrode AE is positioned on the light emitting layer EL. Also, the light emitting element ED is a device for a self-luminous display, and includes an organic light emitting diode (OLED), a light emitting element formed of a quantum dot, or a micro light emitting diode (micro LED).

Further, the anode electrode AE can be referred to as a pixel electrode, and the cathode electrode CE can be referred to as a common electrode. The drain electrode or source electrode of the switching transistor SWT can also be electrically connected to the data line DL. In addition, the source electrode or drain electrode of the switching transistor SWT can be electrically connected to the gate electrode of the driving transistor DRT at the first node N1. Also, the gate electrode of the switching transistor SWT can be electrically connected to the scan signal line SCL, which is a type of gate line GL. The on/off of the switching transistor SWT can also be controlled by the scan signal SCAN supplied from the scan signal line SCL.

In addition, the storage capacitor Cst can be electrically connected between the first node N1 and the second node N2. Also, the storage capacitor Cst maintains a voltage difference between the first node N1 and the second node N2 for a predetermined period of time (e.g., one frame time).

Further, the storage capacitor Cst is not an internal capacitor (parasitic capacitor) of the driving transistor DRT, but is an external capacitor intentionally designed to drive the subpixel SP.

The above description describes each subpixel SP includes a light emitting element ED, two transistors DRT and SWT, and one capacitor Cst. Each subpixel SP can further include one or more transistors and one or more capacitors. For example, as illustrated in FIG. 3, each subpixel SP can further include a sensing transistor SENT for controlling the connection between the second node N2 and the reference voltage line RVL.

Further, the drain electrode or source electrode of the sensing transistor SENT can be electrically connected to the reference voltage line RVL. Also, the source electrode or drain electrode of the sensing transistor SENT can be electrically connected to the source electrode or drain electrode of the driving transistor DRT at the second node N2 and can also be electrically connected to the anode electrode AE. The gate electrode of the sensing transistor SENT can also be electrically connected to the sense signal line SENL, which is a type of gate line GL. Further, the on/off of the sensing transistor SENT can be controlled by the sense signal SENSE supplied from the sense signal line SENL.

In addition, the anode electrode AE can be disposed in each subpixel SP, and can be electrically connected to the source electrode or drain electrode of the driving transistor DRT. In other words, at the second node N2, the anode electrode AE can be electrically connected to the source electrode or drain electrode of the driving transistor DRT.

Further, the cathode electrode CE can be commonly disposed in a plurality of subpixels SP. A direct current (DC)-level base voltage EVSS having no voltage level change can then be applied to the cathode electrode CE. Here, the base voltage EVSS can correspond to a common voltage commonly applied to light emitting elements ED of all the subpixels SP. The display panel 110 can further include a plurality of base lines EVSL electrically connected to the cathode electrode CE.

When the plurality of base lines EVSL are used, the base voltage EVSS can be uniformly applied to the entire area of the cathode electrode CE. The method of supplying the base voltage EVSS using the plurality of base lines EVSL has an effect of efficiently supplying the base voltage EVSS when a large-area cathode electrode CE is provided due to the large-area display panel 110.

In addition, the touch driving circuit 160 can include one or more pre-amplifiers PRE-AMP. In more detail, the pre-amplifier PRE-AMP can include a non-inverting input terminal IN to which the touch driving signal TDS is input, an inverting input terminal INR electrically connected to the touch electrode TE, an output terminal OUT to output an output signal, and a feedback capacitor Cfb connected between the non-inverting input terminal IN and the output terminal OUT.

Further, the present disclosure simplifies the manufacturing process and reduces manufacturing costs by advantageously forming the touch electrode TE with the same material as the anode electrode AE at a position spaced apart on the same layer as the anode electrode AE of the light emitting element ED.

Accordingly, the inverting input terminal INR of the pre-amplifier PRE-AMP can be electrically connected to the touch electrode TE formed on the layer where the anode electrode AE of the light emitting element ED is positioned. The touch driving signal TDS applied to the non-inverting input terminal IN of the pre-amplifier PRE-AMP can be a signal whose voltage level is varied and can have a predetermined frequency and amplitude.

When the user touches the screen with a finger or pen, a capacitance Cf is formed between the touch electrode TE and the finger or pen. The capacitance Cf is called a finger capacitance Cf. The touch circuit 150 can then sense touch coordinates based on a change in the finger capacitance Cf of each touch electrode TE.

Figure 4:
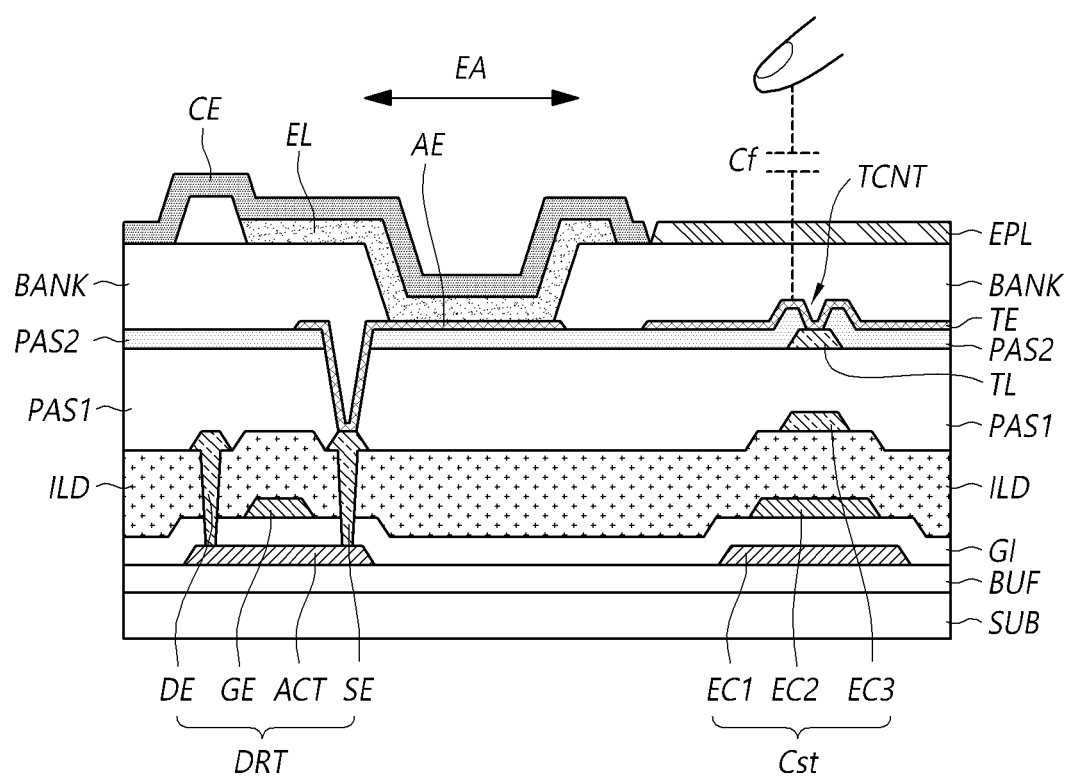
FIG. 4 is a view illustrating an example cross section of a display panel in a touch display device according to embodiments of the disclosure.

Next, FIG. 4 is a view illustrating an example cross section of a display panel in a touch display device according to an embodiment of the disclosure. Referring to FIG. 4, the display panel 110 includes a plurality of subpixels SP formed on a substrate SUB. Each subpixel SP can include a light emitting element ED including an anode electrode AE, a light emitting layer EL, and a cathode electrode CE, a driving transistor DRT for driving the light emitting element ED, and a storage capacitor Cst connected between the gate electrode of the driving transistor DRT and the anode electrode AE.

Transistors DRT, SWT, and SENT and a capacitor Cst as wells as light emitting elements ED are formed on the substrate SUB. In addition, the source electrode SE of the driving transistor DRT is electrically connected to the anode electrode AE of the light emitting element ED. Here, for convenience of description, the sensing transistor SENT is omitted from FIG. 4.

Further, an encapsulation layer can be formed on the cathode electrode CE of the light emitting elements ED. In particular, the encapsulation layer prevents oxygen or moisture from penetrating into the light emitting elements ED. A buffer layer BUF can also be disposed on the substrate SUB, and a driving transistor DRT and a storage capacitor Cst can be formed on the buffer layer BUF. In addition, the semiconductor layer ACT of the driving transistor DRT and the first capacitor electrode EC1 of the storage capacitor Cst can be formed on the buffer layer BUF and formed of the same material on the same layer.

As shown in FIG. 4, a gate insulation film GI can be disposed on the semiconductor layer ACT of the driving transistor DRT and the first capacitor electrode EC1 of the storage capacitor Cst. The gate electrode GE of the driving transistor DRT and the second capacitor electrode EC2 of the storage capacitor Cst can be positioned on the gate insulation film GI. Further, the gate electrode GE of the driving transistor DRT and the second capacitor electrode EC2 of the storage capacitor Cst can be formed of the same material on the same layer.

In addition, an inter-layer insulation film ILD can be disposed on the gate electrode GE of the driving transistor DRT and the second capacitor electrode EC2 of the storage capacitor Cst. Further, the source electrode SE and drain electrode DE of the driving transistor DRT, and the third capacitor electrode EC3 of the storage capacitor Cst can be disposed on the inter-layer insulation film ILD. The source electrode SE and drain electrode DE of the driving transistor DRT and the third capacitor electrode EC3 of the storage capacitor Cst can also be formed of the same material.

In addition, the storage capacitor Cst can have a two-stage structure including the first capacitor electrode EC1, the second capacitor electrode EC2, and the third capacitor electrode EC3, or can have a single-stage structure including the first capacitor electrode EC1 and the second capacitor electrode EC2. The source electrode SE and the drain electrode DE of the driving transistor DRT can also be electrically connected to the semiconductor layer ACT of the driving transistor DRT through a contact hole of the inter-layer insulation film ILD.

Further, a first passivation layer PAS1 can be disposed to cover the source electrode SE, the drain electrode DE, and the third capacitor electrode EC3 of the storage capacitor Cst formed on the inter-layer insulation film ILD. A touch line TL can also be disposed on the first passivation layer PAS1. For an electrical connection with the touch electrode TE, the touch line TL can be disposed at a position overlapping the touch electrode TE.

In addition, a second passivation layer PAS2 can be disposed on the first passivation layer PAS1 to cover the touch line TL. Further, the anode electrode AE can be disposed on the second passivation layer PAS2 at a point defined as the emission area EA of the subpixel SP. The anode electrode AE can also be electrically connected to the source electrode SE of the driving transistor DRT through the contact holes of the first passivation layer PAS1 and the second passivation layer PAS2.

Further, the touch electrode TE can be disposed on the second passivation layer PAS2 at a non-emission area point that does not overlap the emission area EA of the subpixel SP. Because the touch electrode TE is formed of the same material on the same layer as the anode electrode AE, the anode electrode AE and the touch electrode TE can be formed in a single process.

In addition, the touch electrode TE can include a circular or polygonal touch sensor area and a touch bridge line connecting the touch sensor area. The touch electrode TE can also be electrically connected to the touch line TL through the touch contact hole TCNT of the second passivation layer PAS2.

In addition, a bank BANK can be disposed on the anode electrode AE to define the emission area EA of the subpixel SP. In particular, a portion of the bank BANK is open to expose a portion of the anode electrode AE. Accordingly, the open area of the bank BANK can correspond to the emission area EA. Further, a light emitting layer EL is disposed on the anode electrode AE exposed through the open area of the bank BANK, and a cathode electrode CE is disposed on the light emitting layer EL.

As shown in FIG. 4, the cathode electrode CE is not formed where the touch electrode TE and the touch line TL are electrically connected in the non-emission area. In other words, because a finger capacitance Cf is formed between the touch electrode TE and the touch where the touch electrode TE and the touch line TL are electrically connected, it is preferable that the cathode electrode CE does not overlap this position.

That is, it is preferable the touch sensor area and where the touch electrode TE and the touch line TL are electrically connected does not overlap the cathode electrode CE. Thus, after the cathode electrode CE is formed on the bank BANK, the point where the touch electrode TE and the touch line TL are connected can be opened by using a mask. Alternatively, it is possible to form the cathode electrode CE in the emission area EA but not where the touch electrode TE and the touch line TL are connected by depositing the cathode electrode CE after forming the anti-deposition film EPL on the point where the touch electrode TE and the touch line TL are connected.

Further, an encapsulation layer can be disposed on the cathode electrode CE. In more detail, the encapsulation layer can block the penetration of external moisture or oxygen into the light emitting element ED which is vulnerable to external moisture or oxygen. The encapsulation layer can also be formed of one or more layers.

As described above, a buffer layer BUF is disposed on a substrate SUB, and a driving transistor DRT and a storage capacitor Cst are formed on the buffer layer BUF. Further, an inter-layer insulation film ILD is disposed on the driving transistor DRT and the storage capacitor Cst, and a first passivation layer PAS1 is disposed on the inter-layer insulation film ILD. The configurations of the driving transistor DRT and the storage capacitor Cst are also described above with reference to FIG. 4.

Figure 5:
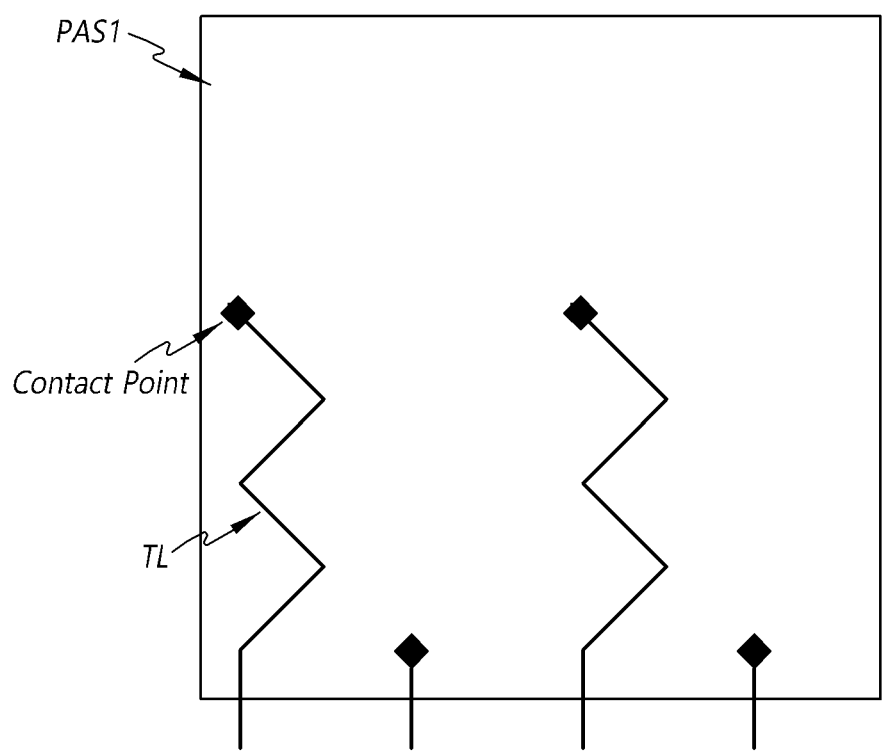
FIGS. 5-8 are plan views illustrating an example of a partial stack structure of a display panel in a touch display device according to embodiments of the disclosure.

In addition, a touch line TL is disposed on the first passivation layer PAS1. the touch line TL can be disposed along the area overlapping the touch electrode TE on the first passivation layer PAS1 as shown in FIG. 5. For example, when the touch electrodes TE are formed in a lattice shape, the touch lines TL can be disposed in a zigzag shape along the lattice shape of the touch electrodes TE. The touch line TL can also be electrically connected to the touch electrode TE at a contact point. One contact point of the touch line TL can be formed in each touch block to which the touch electrode TE is electrically connected.

Figure 6:
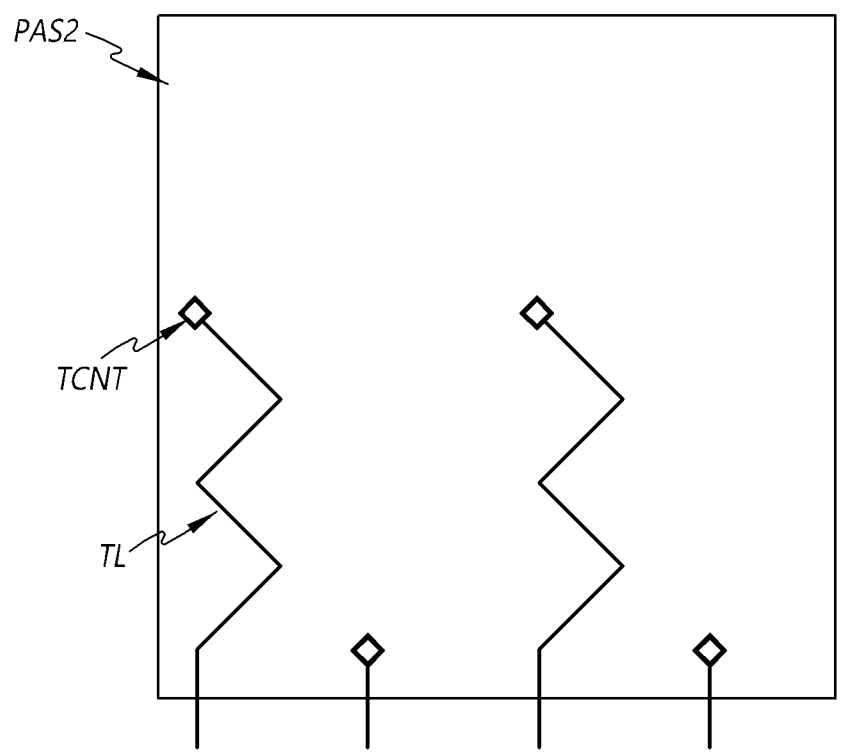

Referring to FIG. 6, a second passivation layer PAS2 can be disposed on the first passivation layer PAS1 to cover the touch line TL, and the touch electrode TE can be electrically connected to the touch line TL through the touch contact hole TCNT of the second passivation layer PAS2. Accordingly, the touch contact hole TCNT can be formed at a position corresponding to the contact point of the touch line TL in the second passivation layer PAS2.

Figure 7:
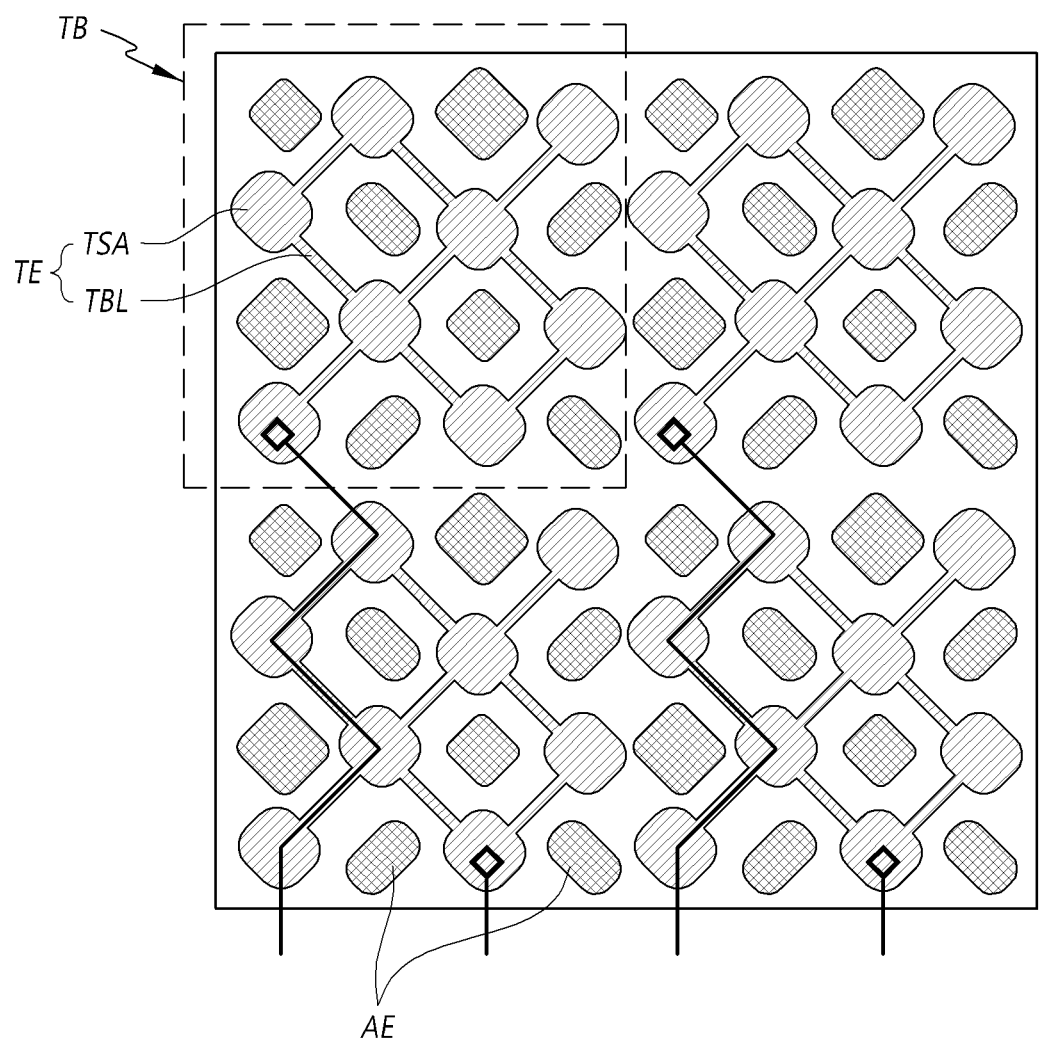

Referring to FIG. 7, the anode electrode AE can be disposed on the second passivation layer PAS2 at a point defined as the emission area EA of the subpixel SP. The anode electrode AE can be electrically connected to the source electrode SE of the driving transistor DRT through the contact holes of the first passivation layer PAS1 and the second passivation layer PAS2.

On the other hand, the touch electrode TE can be disposed on the second passivation layer PAS2 at a non-emission area point that does not overlap the emission area EA of the subpixel SP. Because the touch electrode TE can be formed of the same material on the same layer as the anode electrode AE, the anode electrode AE and the touch electrode TE can be formed in a single process.

In addition, the touch electrode TE can include a circular or polygonal touch sensor area TSA and a touch bridge line TBL connecting the touch sensor area TSA. The touch sensor area TSA can also be formed to be larger than the touch bridge line TBL, and the touch bridge line TBL can be formed in a straight-line shape connecting the touch sensor areas TSA.

Further, the touch electrode TE includes a plurality of touch blocks TB where the touch sensor area TSA and the touch bridge line TBL are electrically connected to each other. Also, the touch electrodes TE formed on the display panel 110 can be divided into a plurality of touch blocks TB. The touch line TL is also electrically connected to the touch electrode TE at a contact point. For example, one contact point of the touch line TL can be formed in each touch block to which the touch electrode TE is electrically connected.

Because the touch sensor area TSA and the touch bridge line TBL positioned in one touch block TB are electrically connected, the touch driving signal TDS transferred from the touch line TL through the contact point is transferred to the touch sensor area TSA positioned in the touch block TB. FIG. 7 illustrates an example in which the touch sensor area TSA and the touch bridge line TBL are disposed in a lattice form in the touch block TB.

Figure 8:
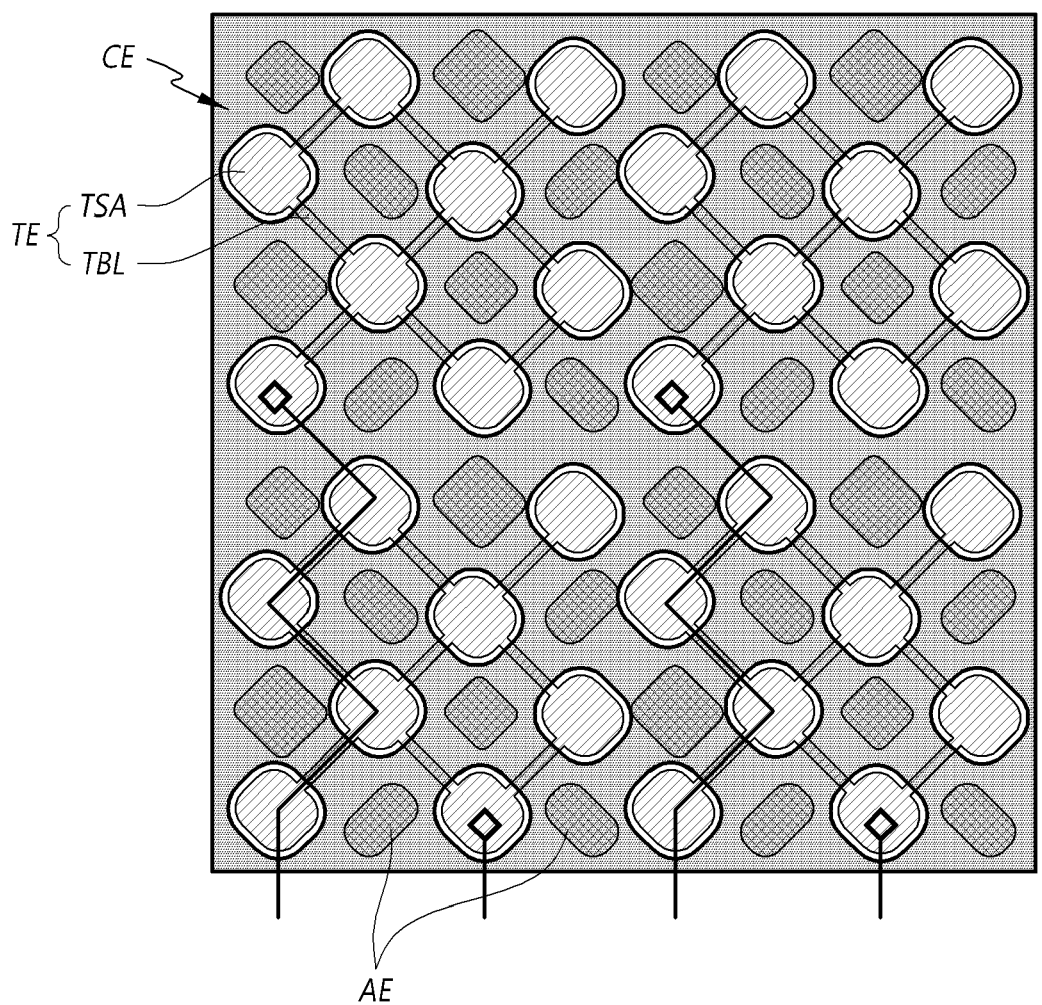

Referring to FIG. 8, the cathode electrode CE can be disposed on the anode electrode AE but is not formed on the touch sensor area TSA constituting the touch electrode TE. In particular, the cathode electrode CE cannot overlap the point where the touch electrode TE and the touch line TL are electrically connected.

Thus, and as described above, after the cathode electrode CE is formed on the bank BANK, the point corresponding to the touch sensor area TSA is opened by using a mask. Alternatively, the cathode electrode CE can be prevented from being deposited by forming an anti-deposition film EPL on the touch sensor area TSA.

Thus, a touch display device 100 capable of effective touch sensing and simplifying the manufacturing process is provided. That is, the touch electrode TE is formed of the same material on the same layer as the anode electrode AE of the light emitting element ED, but the cathode electrode CE is not deposited on the touch sensor area TSA of the touch electrode TE.

As the open area of the cathode electrode CE is larger than the touch sensor area TSA, no overlapping area is formed between the cathode electrode CE and the touch sensor area TSA. Alternatively, as the open area of the cathode electrode CE is formed to be slightly smaller than the touch sensor area TSA, the cathode electrode CE only overlaps the edge portion of the touch sensor area TSA.

Figure 9:
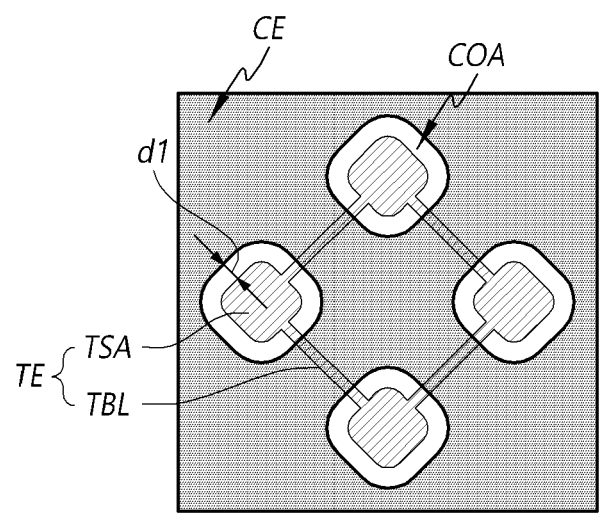
FIG. 9 is a view illustrating an example in which an open area of a cathode electrode is formed to be larger than a touch sensor area in a touch display device according to embodiments of the disclosure.
Figure 10:
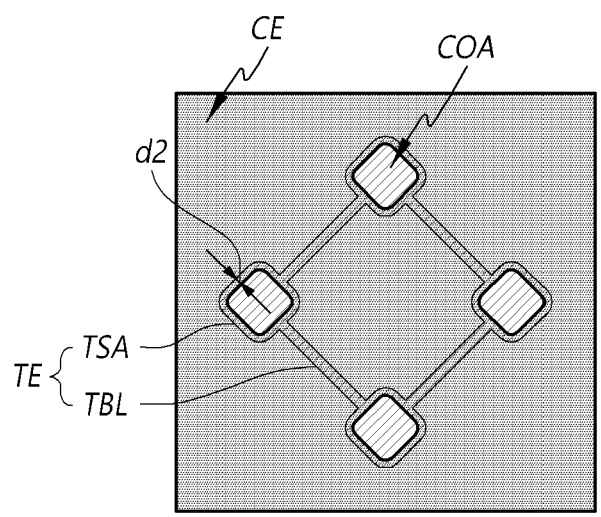
FIG. 10 is a view illustrating an example in which an open area of a cathode electrode is formed to be slightly smaller than a touch sensor area in a touch display device according to embodiments of the disclosure.

Next, FIG. 9 is a view illustrating an example where the open area of the cathode electrode CE is formed to be larger than the touch sensor area in the touch display device according to embodiments of the disclosure, and FIG. 10 is a view illustrating the open area of the cathode electrode CE is formed to be slightly smaller than the touch sensor area.

Referring to FIGS. 9 and 10, the cathode electrode CE includes a cathode open area COA to correspond to the touch sensor area TSA. As shown in FIG. 9, the cathode open area COA can be formed to be larger than the touch sensor area TSA constituting the touch electrode TE.

In this instance, as the separation distance d1 between the boundary of the cathode open area COA and the touch sensor area TSA decreases, the proportion of the exposed touch sensor area TSA increases, so that touch performance can increase. For example, the separation distance d1 between the boundary of the cathode open area COA and the touch sensor area TSA can be less than or equal to 10 μm.

As shown in FIG. 10, the cathode open area COA can be formed to be smaller than the touch sensor area TSA constituting the touch electrode TE. In this instance, a portion of the touch sensor area TSA overlaps the cathode electrode CE, and the parasitic capacitance between the touch electrode TE and the cathode electrode CE can increase. For example, the overlapping distance d2 between the boundary of the cathode open area COA and the touch sensor area TSA can be less than or equal to 10 μm.

Thus, considering touch performance and parasitic capacitance, the separation distance d1 between the boundary of the cathode open area COA and the touch sensor area TSA can be 10 μm or less, or the overlapping distance d2 between the boundary between the cathode open area COA and the touch sensor area TSA can be 10 μm or less. Also, even though an example of the touch sensor area TSA of the touch electrode TE is disposed in a rhombus shape has been described, the touch electrode TE can be formed by the touch bridge line TBL and the touch sensor area TSA arranged in the horizontal direction.

Figure 11:
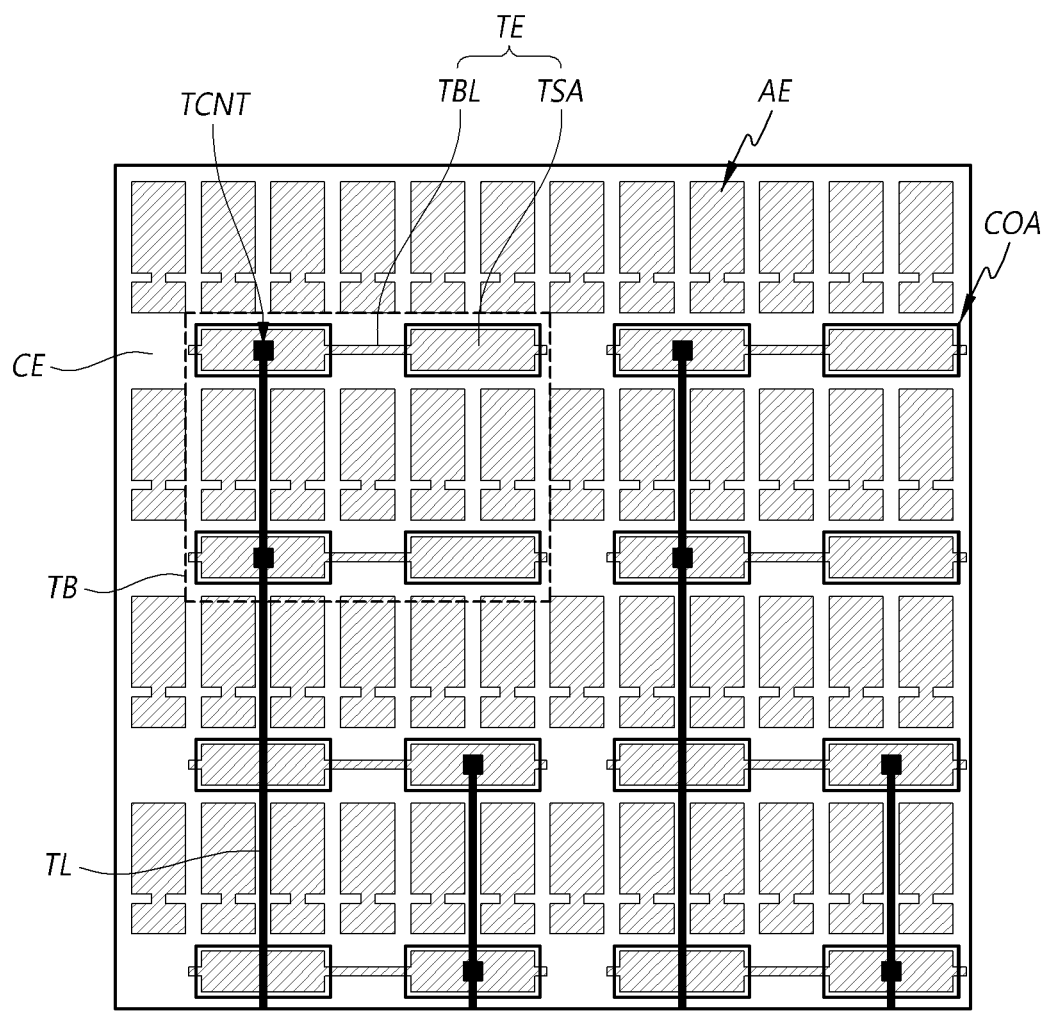
FIG. 11 is a view illustrating an example in which a touch electrode is formed by a touch bridge line and a touch sensor area in a horizontal direction in a touch display device according to embodiments of the disclosure.

In particular, FIG. 11 is a view illustrating an example in which a touch electrode TE is formed by a touch bridge line TBL and a touch sensor area TSA in a horizontal direction in a touch display device according to embodiments of the disclosure. Referring to FIG. 11, the touch electrode TE can be disposed on the same layer as the anode electrode AE in a space between the anode electrodes AE.

In this example, the touch sensor area TSA constituting the touch electrode TE has a rectangular structure extending in the horizontal direction, and the touch bridge line TBL is formed to connect the adjacent touch sensor areas TSA in the horizontal direction. Here, the touch line TL is connected to the touch sensor area TSA through the touch contact hole TCNT, thereby electrically connecting the touch sensor area TSA positioned in one touch block TB.

As such, even when the touch sensor area TSA has a rectangular structure extending in the horizontal direction, the cathode open area COA can be formed to expose the touch sensor area TSA. FIG. 11 illustrates an example in which the cathode open area COA corresponds to the touch sensor area TSA is larger than the touch sensor area TSA.

Further, in another embodiment of the touch display device 100 of the disclosure, a floating electrode formed of the same material as the cathode electrode CE is formed on the touch sensor area TSA of the touch electrode TE. In addition, the floating electrode and the cathode electrode CE can be electrically separated from each other.

Figure 12:
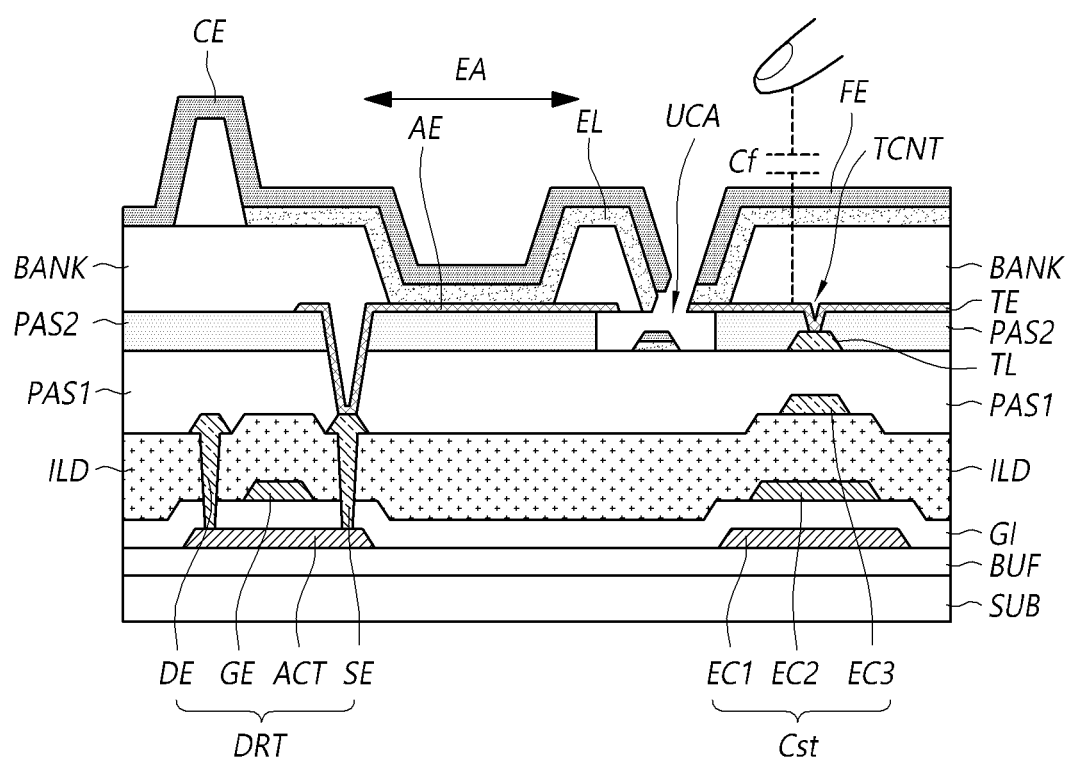
FIG. 12 is a view illustrating an example cross section of another display panel in a touch display device according to embodiments of the disclosure.

In particular, FIG. 12 is a cross-sectional view of a display panel in a touch display device according to an embodiment of the disclosure.

As shown, a buffer layer BUF is disposed on a substrate SUB, and a driving transistor DRT and a storage capacitor Cst are formed on the buffer layer BUF. Further, a semiconductor layer ACT of the driving transistor DRT and the first capacitor electrode EC1 of the storage capacitor Cst are formed on the buffer layer BUF. The semiconductor layer ACT and the first capacitor electrode EC1 can be formed of the same material on the same layer.

Further, a gate insulation film GI is disposed on the semiconductor layer ACT and the first capacitor electrode EC1. The gate electrode GE of the driving transistor DRT and the second capacitor electrode EC2 of the storage capacitor Cst are also positioned on the gate insulation film GI. In addition, the gate electrode GE and the second capacitor electrode EC2 can be formed of the same material on the same layer.

An inter-layer insulation film ILD is also disposed on the gate electrode GE and the second capacitor electrode EC2. Further, the source electrode SE and drain electrode DE of the driving transistor DRT, and the third capacitor electrode EC3 of the storage capacitor Cst are disposed on the inter-layer insulation film ILD. The source electrode SE and drain electrode DE of the driving transistor DRT and the third capacitor electrode EC3 of the storage capacitor Cst are further formed of the same material.

In addition, the storage capacitor Cst can have a two-stage structure including the first capacitor electrode EC1, the second capacitor electrode EC2, and the third capacitor electrode EC3, or can have a single-stage structure including the first capacitor electrode EC1 and the second capacitor electrode EC2. The source electrode SE and the drain electrode DE of the driving transistor DRT can be electrically connected to the semiconductor layer ACT of the driving transistor DRT through a contact hole of the inter-layer insulation film ILD.

Further, a first passivation layer PAS1 is disposed to cover the source electrode SE, the drain electrode DE, and the third capacitor electrode EC3 of the storage capacitor Cst formed on the inter-layer insulation film ILD. A touch line TL is also disposed on the first passivation layer PAS1. For electrical connection with the touch electrode TE, the touch line TL is disposed at a position overlapping the touch electrode TE.

In addition, a second passivation layer PAS2 is disposed on the first passivation layer PAS1 to cover the touch line TL. The anode electrode AE can be disposed on the second passivation layer PAS2 at a point defined as the emission area EA of the subpixel SP. The anode electrode AE can be electrically connected to the source electrode SE of the driving transistor DRT through the contact holes of the first passivation layer PAS1 and the second passivation layer PAS2.

Further, the touch electrode TE is disposed on the second passivation layer PAS2 at a non-emission area point that does not overlap the emission area EA of the subpixel SP. Because the touch electrode TE can be formed of the same material on the same layer as the anode electrode AE, the anode electrode AE and the touch electrode TE can be formed in a single process.

In addition, the touch electrode TE can include a circular or polygonal touch sensor area TSA and a touch bridge line TBL connecting the touch sensor area TSA. The touch electrode TE can be electrically connected to the touch line TL through the touch contact hole TCNT of the second passivation layer PAS2. To define the emission area EA of the subpixel SP, a bank BANK can be disposed on the anode electrode AE and the touch electrode TE.

Also, a portion of the bank BANK can be opened to expose a portion of the anode electrode AE, thereby forming an emission area EA. An undercut area UCA having a recessed lower portion in the boundary area of the touch electrode TE and the anode electrode AE can also be formed by dry-etching or wet-etching the area between the anode electrode AE and the touch electrode TE while simultaneously forming the emission area EA.

Further, the undercut area UCA is formed below the boundary area between the anode electrode AE and the touch electrode TE such that a portion of the second passivation layer PAS2 is depressed, and the first passivation layer PAS1 is partially exposed. Thus, when the light emitting layer EL is deposited on the bank BANK, the light emitting layer EL can be disposed on the anode electrode AE exposed to the open area of the bank BANK. Further, the light emitting layer EL can also be formed on the first passivation layer PAS1 inside the undercut area UCA.

Then, when a material forming the cathode electrode CE is deposited, the cathode electrode CE can be disposed on the light emitting layer EL in the emission area EA. On the other hand, because the upper portion of the touch electrode TE is separated from the emission area EA by the undercut area UCA, the floating electrode FE, which is separated from the cathode electrode CE and is formed of the same material as the cathode electrode CE, can be formed on the touch electrode TE.

Although the cathode electrode CE and the floating electrode FE are formed of the same material on the same layer, the electrode can be referred to as the cathode electrode when it is formed in the emission area EA and as the floating electrode FE when it is formed in the non-emission area where the touch electrode TE is positioned. Further, a layer formed of the same material as that of the cathode electrode CE can be formed inside the undercut area UCA.

In this instance, because the floating electrode FE on the touch electrode TE should be electrically separated from the cathode electrode CE of the emission area EA, it is preferable that the thickness of the second passivation layer PAS2 is larger than the thickness of the cathode electrode material and the light emitting layer EL formed in the undercut area UCA. As a result, because the floating electrode FE formed in the non-emission area between the emission areas EA is electrically separated from the cathode electrode CE, a finger capacitance Cf can be formed between the finger or pen and the touch electrode TE.

An encapsulation layer is then disposed on the cathode electrode CE and the floating electrode FE. In particular, the encapsulation layer can block penetration of external moisture or oxygen into the light emitting element ED which is vulnerable to external moisture or oxygen. The encapsulation layer can also be formed of one or more layers.

Embodiments of the disclosure described above are briefly described below.

A display panel 110 according to embodiments of the disclosure can include a substrate SUB, a transistor formed over the substrate SUB, a first passivation layer PAS1 formed to cover the transistor, a touch line TL formed on the first passivation layer PAS1, a second passivation layer PAS2 formed to cover the touch line TL, an anode electrode AE formed in an emission area EA on the second passivation layer PAS2 and electrically connected to the transistor through a contact hole of the first passivation layer PAS1 and the second passivation layer PAS2, a touch electrode TE formed on the second passivation layer PAS2 at a position spaced apart from the anode electrode AE and electrically connected to the touch line TL through a touch contact hole TCNT of the second passivation layer PAS2, a bank BANK covering the anode electrode AE and the touch electrode TE and having the emission area EA open, and a light emitting layer EL and a cathode electrode CE sequentially formed on the anode electrode AE in the emission area EA. The present disclosure also provides a corresponding display device including the display panel 110.

The touch electrode TE can be formed of the same material as the anode electrode AE, can be disposed in a lattice shape in an area where the anode electrode AE is not formed, and can include a circular or polygonal touch sensor area TSA and a touch bridge line TBL connecting the touch sensor area TSA.

The touch electrode TE can also include a plurality of touch blocks TB in which the touch sensor area TSA and the touch bridge line TBL are electrically connected. Each touch block can be electrically insulated. The touch line TL can extend along the touch sensor area TSA and the touch bridge line TBL.

Further, the touch line TL can be electrically connected to the touch electrode TE in the touch sensor area TSA. Also, the cathode electrode CE can have a cathode open area COA formed on the bank BANK at a position corresponding to the touch sensor area TSA. The cathode open area COA can be formed to be larger than the touch sensor area TSA. In addition, the cathode open area COA can partially overlap the touch sensor area TSA. The display panel 110 can further comprise an anti-deposition film EPL formed on an upper portion of the bank BANK at a position corresponding to the touch sensor area TSA.

A display panel 110 according to the disclosure can include a substrate SUB, a transistor formed over the substrate SUB, a first passivation layer PAS1 formed to cover the transistor, a touch line TL formed on the first passivation layer PAS1, a second passivation layer PAS2 formed to cover the touch line TL and including an undercut area UCA between an emission area EA and a non-emission area, an anode electrode AE formed in the emission area EA on the second passivation layer PAS2 and electrically connected to the transistor through a contact hole of the first passivation layer PAS1 and the second passivation layer PAS2, a touch electrode TE formed in the non-emission area on the second passivation layer PAS2 at a position spaced apart from the anode electrode AE and electrically connected to the touch line TL through a touch contact hole TCNT of the second passivation layer PAS2, a bank BANK covering the anode electrode AE and the touch electrode TE and having the emission area EA open, a light emitting layer EL and a cathode electrode CE sequentially formed on the anode electrode AE in the emission area EA, and a floating electrode FE formed at a position spaced apart from the cathode electrode CE in the non-emission area. The present disclosure also provides a corresponding display device including the display panel 110.

The floating electrode FE can be formed of the same material as the cathode electrode CE. In addition, the second passivation layer PAS2 can be formed to be thicker than a light emitting layer EL material and a cathode electrode CE material formed in the undercut area UCA. The cathode electrode CE and the floating electrode FE can be electrically insulated by the undercut area UCA.

A display panel according to the disclosure can include a plurality of anode electrodes arranged into a first pattern, and a plurality of touch sensing areas arranged into a second pattern electrically separated from the plurality of anode electrodes arranged into the first pattern, wherein touch sensing areas included in a touch block are connected together via a plurality of touch bridge lines electrically separated from the plurality of anode electrodes, wherein each touch block includes a same number of anode electrodes and touch sensing areas, and wherein a touch line is connected to one touch sensing area in each block for receiving a touch signal from any of the touch sensing areas included the touch block.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A display panel, comprising:
   a substrate;
   a driving transistor on the substrate;
   a first passivation layer covering the driving transistor;
   a touch line on the first passivation layer;
   a second passivation layer covering the touch line;
   an anode electrode on the second passivation layer and electrically connected to the driving transistor through a contact hole in the first passivation layer and the second passivation layer;
   a touch electrode on the second passivation layer spaced apart from the anode electrode and electrically connected to the touch line through a touch contact hole of the second passivation layer;
   a bank covering the anode electrode and the touch electrode and having an opening corresponding to an emission area; and
   a light emitting layer and a cathode electrode sequentially disposed on the anode electrode in the emission area.

2. The display panel of claim 1, wherein the touch electrode and the anode electrode are on the same layer and include a same material.

3. The display panel of claim 1, wherein the touch electrode is disposed in a lattice shape in areas where the anode electrode is not formed.

4. The display panel of claim 1, wherein the touch electrode includes:
a plurality of circular or polygonal touch sensor areas; and
a touch bridge line electrically connecting the touch sensor areas.

5. The display panel of claim 4, further comprising:
a plurality of touch blocks, each touch block including the plurality of the touch sensor areas and a corresponding touch bridge line electrically connected to one of the touch sensor areas, and
wherein each touch block is electrically insulated.

6. The display panel of claim 4, wherein the touch line extends along the touch sensor areas and the touch bridge line.

7. The display panel of claim 6, wherein the touch line is electrically connected to the touch electrode in the touch sensor area.

8. The display panel of claim 4, wherein the cathode electrode has a cathode open area on the bank corresponding to the touch sensor area.

9. The display panel of claim 8, wherein the cathode open area is larger than the touch sensor area.

10. The display panel of claim 8, wherein the cathode open area partially overlaps the touch sensor area.

11. The display panel of claim 4, further comprising:
an anti-deposition film on an upper portion of the bank at a position corresponding to the touch sensor area.

12. The display panel of claim 1, wherein the second passivation layer includes an undercut area between the emission area and a non-emission area, and
wherein a floating electrode is formed at a position spaced apart from the cathode electrode in the non-emission area.

13. The display panel of claim 12, wherein the floating electrode includes a same material as the cathode electrode.

14. The display panel of claim 12, wherein the second passivation layer is thicker than a light emitting layer material and a cathode electrode material formed in the undercut area.

15. The display panel of claim 12, wherein the undercut area electrically insulates the cathode electrode and the floating electrode.

16. A touch display device, comprising:
a display panel including:
a substrate;
a driving transistor on the substrate;
a first passivation layer covering the driving transistor;
a touch line formed on the first passivation layer;
a second passivation layer covering the touch line;
an anode electrode formed on the second passivation layer and electrically connected to the driving transistor through a contact hole in the first passivation layer and the second passivation layer;
a touch electrode formed on the second passivation layer at a position spaced apart from the anode electrode and electrically connected to the touch line through a touch contact hole of the second passivation layer;
a bank covering the anode electrode and the touch electrode and having an opening corresponding to an emission area;
a light emitting layer and a cathode electrode sequentially formed on the anode electrode in the emission area; and
a touch circuit supplying a touch driving signal to the touch electrode through the touch line and detecting a touch through a touch sensing signal transferred from the touch electrode.

17. A display panel, comprising:
a plurality of anode electrodes arranged into a first pattern;
a plurality of touch sensing areas arranged into a second pattern electrically separated from the plurality of anode electrodes arranged into the first pattern; and
a cathode electrode covering the plurality of anode electrodes and a plurality of touch bridge lines without covering the plurality of touch sensing areas,
wherein touch sensing areas included in a touch block are connected together via the plurality of touch bridge lines electrically separated from the plurality of anode electrodes,
wherein each touch block includes a same number of anode electrodes and touch sensing areas, and
wherein a touch line is connected to one touch sensing area in each block for receiving a touch signal from any of the touch sensing areas included the touch block.

18. The display panel of claim 17, wherein a corresponding touch sensing area is larger than a corresponding touch electrode included in the corresponding touch sensing area by a distance less than or equal to 10 μm.

19. The display panel of claim 17, wherein a corresponding touch sensing area is smaller than a corresponding touch electrode included in the corresponding touch sensing area by a distance less than or equal to 10 μm.

* * * * *